(12) United States Patent
Di Giandomenico et al.

(10) Patent No.: US 6,965,275 B2
(45) Date of Patent: Nov. 15, 2005

(54) METHOD AND APPARATUS FOR TUNING A FILTER

(75) Inventors: Antonio Di Giandomenico, Villach (AT); Francesco Corsi, Bari (IT); Gianvito Matarrese, Bari (IT); Cristoforo Marzocca, Molfetta (IT); Andrea Baschirotto, Tortona (IT); Stefano D'Amico, Corsano (IT)

(73) Assignee: Infineon Technologies AG, Munchen (DE)

( * ) Notice: Subject to any disclaimer, the term of this patent is extended or adjusted under 35 U.S.C. 154(b) by 46 days.

(21) Appl. No.: 10/778,610

(22) Filed: Feb. 13, 2004

(65) Prior Publication Data

US 2005/0179505 A1    Aug. 18, 2005

(51) Int. Cl.[7] ............................ H03H 7/12; H04B 3/04; G01R 23/02
(52) U.S. Cl. ................. 333/17.1; 333/174; 327/553; 324/606; 324/607
(58) Field of Search ................ 333/17.1, 166, 333/171, 174; 327/552, 553; 324/605–607, 324/602; 716/2, 4

(56) References Cited

U.S. PATENT DOCUMENTS

| | | | |
|---|---|---|---|
| 3,732,410 A * | 5/1973 | Mackechnie | ................. 708/322 |
| 5,136,267 A * | 8/1992 | Cabot | ......................... 333/174 |
| 5,281,931 A * | 1/1994 | Bailey et al. | .............. 333/17.1 |
| 5,392,456 A * | 2/1995 | Mitomo et al. | ........ 340/825.21 |
| 5,471,168 A * | 11/1995 | Sevenhans et al. | .......... 327/553 |
| 6,014,554 A * | 1/2000 | Smith | ......................... 455/340 |
| 6,686,809 B2 * | 2/2004 | Nystrom et al. | ........... 333/17.1 |
| 6,803,813 B1 * | 10/2004 | Pham | ......................... 327/553 |

OTHER PUBLICATIONS

V. Gopinathan, Y.P. Tsividis, K:-S. Tan, and R.K. Hester, "Design Considerations for High-Frequency Continuous—Time Filters and Implementation of an Antialising Filter for Digital Video", IEEE Journal of Solid State Circuits, Dec. 1990, pp. 1368-1378.

A.M. Durham and W. Redman-White, "Integrated continuous—time balanced filters for 16-b DSP interfaces", IEEE Journal of Solid-State Circuits, vol. 28, No. 7, Jul. 1993, Microelectronic Design Centers Austria GmbH, Design Center Villach Siemensstrasse 2, A-9500 Villach, pp. 835-839.

Y.P. Tsividis, "Integrated Continuous—Time Filter Design—An Overview", IEEE Journal of Solid-State Circuits, vol. 29, No. 3, Mar. 1994, pp. 166-176.

F. Corsi, C. Marzocca, G. Matarrese, "An approach to the classification of mixed-signal circuits in a pseudorandom testing scheme", Proceedings of the IEEE Design, Automation and Test in Europe Conference and Exhibition, 2003, pp. 1178-1179.

(Continued)

*Primary Examiner*—Barbara Summons
(74) *Attorney, Agent, or Firm*—Maginot, Moore & Beck (57) ABSTRACT

A method and an apparatus for tuning a filter is provided wherein the filter has at least one adjustable element for adjusting at least one performance parameter of the filter like for example a cut-off frequency, wherein a pseudo-random test sequence is applied to the filter, wherein the cross-correlation function of the test sequence and the filtered test sequence is calculated, and wherein the at least one adjustable parameter is adjusted until the cross-correlation function at at least one point basically coincides with a corresponding point of a nominal cross-correlation function for the filter.

36 Claims, 5 Drawing Sheets

OTHER PUBLICATIONS

D. Manstratta, R. Castello, F. Gatta, P. Rossi, F. Svelto, "A 0.18 µm CMOS Direct-conversion receiver front-end for UMTS", IEEE International Solid-State Circuits Conference, vol. XLV, Feb. 2002, (10 pages).

A. Di Giandomenico, P. Greco, O. Wiedenbauer, F. Corsi, C. Marzocca, "Testing a High-Speed Embedded Analogue Filter by a low-cost digital tester", Proceedings of the IEEE International Mixed-Signal Testing Workshop, 2000, pp. 238-242.

* cited by examiner

METHOD AND APPARATUS FOR TUNING A FILTER

FIELD OF THE INVENTION

The present invention relates to a method and an apparatus for tuning a filter, in particular for tuning an analog continuous-time filter used in communication systems. However, the invention may be applied to other filters as well.

BACKGROUND

Analog filters are fundamental blocks in analog and mixed-mode signal processing. In telecommunication receiver systems, for instance, an analog filter located in front of an Analog-to-Digital-Converter (ADC) may be employed to reduce out-of-band noise and to reject adjacent undesired communication channels or to select a desired communication channel. Several techniques have been employed to realize such analog filters to be embedded in a single-chip silicon-based transceiver systems. The main types of filters used are so-called sampled-data systems and continuous-time systems.

The most widely used type of sampled-data filters is the switched capacitor filter, wherein resistors are replaced by switched capacitors, the switching frequency of which determines the value of the "resistor". These filters require precise performances of their active devices, for example a large unity-gain-bandwidth of an operational amplifier used. This leads, in general, to an increased power consumption and an increased complexity. On the other hand, these filters have the advantage that they guarantee a very accurate frequency response without the use of any tuning system, since their coefficients or properties are mainly determined by the ratio of homogeneous quantities, for example by the ratios of capacitors used.

In contrast, continuous-time filters have in general less stringent requirements for the performance of their active devices, i.e. operational amplifiers may operate with lower unity-gain-bandwidth. However, time-constants or other performance parameters of these filters are defined by uncorrelated components, for example by a product of a resistance and a capacitance (R·C) or a ratio of transconductance to capacitance (gm/C). Therefore, a tuning system is needed to align the frequency response of these filters, in particular to compensate for component variations (in particular variations of resistors and capacitors used) from nominal values due to technological spread, aging, temperature etc. and to align the filter frequency response to a desired target frequency response, for instance if the filter is used in a multistandard telecommunication device which needs different frequency responses for different standards.

Possible tuning techniques known in the art are described for example in V. Gopinathan, Y. P. Tsividis, K:-S. Tan, and R. K. Hester "Design Considerations for High-Frequency Continuous-Time Filters and Implementation of an Anti-aliasing Filter for Digital Video", IEEE Journal of Solid State Circuits, December 1990, pp. 1368–1378, in Y. Tsividis, "Self-tuned filters," Electron. Lett., vol. 17, pp. 406–407, June 1981, in A. M. Durham and W. Redhman-Whhe, "Integrated continuous-time balanced filters for 16-b DSP interfaces," IEEE J. Solid-State Circuits, vol. 28, pp. 835–839, July 1993, in J. B. Hugjes, N. C. Bird, R. S. Soin, "A Novel Digitally Self-Tuned Continuous-Time filter Technique", Intern. Symp. On Circuits and Systems, ISCAS 1986, pp. 1177–1180, or in Y. P. Tsividis, "Integrated Continuous-Time Filter Design—An Overview", IEEE J. Solid-State Circuits, March 1994, pp. 166–176. These techniques use different kinds of input signal patterns to be applied to the filter and evaluate the filter response to control or tune one or more parameters of the filter like gain, pole frequency or even the complete frequency response behavior.

For example, in pure analog systems, a signal with a fixed frequency or DC voltage is used as the input signal pattern. The use of an input signal with a single frequency results in a measurement of the effective filter frequency response to this frequency. However, in this case, noise can affect the tuning accuracy. Furthermore, for digital evaluation, a high resolution ADC is needed to sample the response of the filter. The use of a direct current (DC) voltage as an input signal does not include the measurement of a frequency response at all.

On the other hand, with increasing miniaturization of electronic circuits the possibility for downscaling a complete filtering system is an important issue.

It is therefore an object of the present invention to provide a method and an apparatus for tuning a filter which is easy to implement, downscalable and which gives the possibility to tune all desired filter parameters and takes the frequency response of the filter into account.

SUMMARY

According to embodiments of the invention, a method and an apparatus for tuning a filter is proposed wherein the filter has at least one adjustable element for adjusting at least one performance parameter of the filter, wherein a pseudorandom test sequence is applied to the filter, wherein at least one sample of a cross-correlation function of the test sequence and the filtered test sequence is calculated, and wherein the at least one adjustable element is adjusted until the at least one sample of the calculated cross-correlation function basically coincides with a corresponding sample of a desired cross-correlation function for the filter. If the at least one sample is chosen accordingly, after the tuning procedure the calculated cross-correlation function will coincide with the nominal cross-correlation function over a wide range of samples.

Of course, instead of calculating only the at least one sample of the cross-correlation function, larger portions or the whole cross-correlation function comprising the at least one sample may be calculated.

In particular, the desired cross-correlation function may be equal to or be an estimate of a desired impulse response function for the filter.

Such a method and apparatus for tuning a filter can be easily implemented. In particular, digital elements for calculating the cross-correlation function and for generating the pseudo-random test sequence may be used. These digital elements have low cost, which leads to an inexpensive implementation of the apparatus according to the invention.

The method and the apparatus are particularly suited for tuning a time-continuous filter and may be integrated with the filter.

In case a plurality of performance parameters has to be adjusted, for adjusting one particular performance parameter the at least one sample is preferably chosen so that the partial derivative of the cross-correlation function with respect to the performance parameter to be adjusted is, at that sample, larger, in absolute values, than the partial derivatives of the cross-correlation function at that sample with respect to the remaining performance parameters.

It is also desirable that the at least one sample corresponds to a zero-crossing of the nominal cross-correlation function since in this case the at least one adjustable element may be adjusted depending on whether the at least one sample of the calculated cross-correlation function is greater or smaller than zero. Of course, a sample with a value other than zero can be taken as a threshold for comparing with a calculated cross-correlation function as well.

The pseudo-random test sequence is preferably generated by a Linear Feedback Shift Register which is easily implemented and variants of which are commercially available. This pseudo-random test sequence can be applied to the filter via a Digital-to-Analog-Converter (DAC). If the pseudo-random test sequence can only assume two states, a one-bit DAC may be used the output of which connects to one of two given voltages depending on the current value of the pseudo-random test sequence.

The filtered test sequence can be converted by an Analog-to-Digital-Converter (ADC) so that the calculation of the cross-correlation function can be performed digitally. In many cases, a one-bit ADC is sufficient which makes the implementation easy and cheap. The sampling frequency of this ADC should be greater than the inverse period of the pseudo-random test sequence in order to obtain sufficient data for calculating the at least one sample cross-correlation function.

The at least one performance parameter of the filter which is to be adjusted may comprise a cut-off frequency, a quality factor or a gain.

A filter to which the method or the apparatus may be applied may be a low-pass filter like a Butterworth filter based on multipath biquadratic cells. The at least one adjustable element therein may be a capacitor designed as a capacitor array which may be digitally controlled.

Of course, of the various features described above, just one, some or all may be implemented to realize the method or the apparatus of the present invention.

These and other features and advantages of the present invention will become more apparent when studying the following detailed description of specific embodiments in connection with the accompanying drawings.

DETAILED DESCRIPTION

According to the present invention, a filter is tuned by comparing a cross-correlation function calculated from a pseudo-random testing pattern applied to a filter and a corresponding filter response. Before embodiments employing this principle will be described, some theoretical background concerning the method employed in the present invention will be described.

In particular, it will be shown that the cross-correlation function in this case is an estimate of the impulse response h(t) of the filter. A detailed description thereof can be found in C. Y. Pan, K. T. Cheng, "Pseudo-Random Testing for Mixed-Signal Circuits", IEEE Trans. on Computer-Aided Design, vol. 16, n. 10, 1997, or in A. Al-Dabbagh, M. Darnell, A. Noble, S. Farquhar, "Accurate System Identification Using Inputs with Imperfect Autocorrelation Properties", IEE Electronics Letters, vol. 33, no. 17, 1997.

For continuous-time signals and a stationary input signal x(t), the cross-correlation function Rxy(t) of the filter is given by $$Rxy(t) \cong \lim_{T \to \infty} \frac{1}{T} \int_0^T x(\tau) y(t+\tau) d\tau \quad (1)$$

wherein y(t) is the response of the filter, that is, the filtered input x(t). For an ergodic or stationary input signal x(t), that is a signal where for example transition probabilities in one period of time are representative for the whole time evolution of the signal, the cross-correlation function Rxy(t) can be expressed as a static average:

$$Rxy(t) = E[x(\tau)y(t+\tau)] = \int_{-\infty}^{\infty} h(\theta) Rxy(t-\theta) d\theta = Rxx(t) * h(t) \quad (2)$$

wherein E is the expected-value-function, h is the impulse response of the filter, Rxx(t) represents the auto-correlation function of x(t) and "*" is the convolution operator.

When the input signal x(t) has a spectrum corresponding to ideal white noise, Rxx(t) is the Dirac distribution δ(t), therefore Rxy(t) is equal to h(t).

In the embodiments described hereinafter or in other typical on-chip implementation of a calculation of the cross-correlation function, x(t) will deviate from ideal white noise. Typically, x(t) is a finite length sequence of L rectangular pulses of constant width Δt, wherein the amplitude of each pulse can assume a positive or a negative value with the same probability.

The auto-correlation function of such a signal is:

$$Rxx(t) = \lim_{L \to \infty} \frac{1}{2L+1} \sum_{n=-L}^{L} \frac{1}{\Delta t} \int_{n\Delta t}^{(n+1)\Delta t} x(\tau) x(t+\tau) d\tau \quad (3)$$

In practical realizations, even for L→∞ Rxx(t) is only an approximation of the Dirac distribution; its shape is a triangular pulse of a width depending on Δt as follows:

$$Rxx(t) = \begin{cases} 1 - \dfrac{t}{\Delta t} & |t| \leq \Delta t \\ 0 & |t| > \Delta t \end{cases} \quad (4)$$

Furthermore, in practice, L is always a finite number, as the sequence of the input signal x(t) has a finite length. This introduces a tail in the auto-correlation function Rxx(t), i.e. the triangle is "smeared out". This in turn affects the accuracy of the estimated impulse response h(t) especially for large values of t if the cross-correlation function Rxy(t) is used as this estimate.

Consequently, the width of the single pulses Δt and the length L of the sequence must be carefully chosen depending on the bandwidth of the filter to be tuned and on the accuracy of the estimation of h(t) required for the tuning operation. Furthermore, it has to be taken into account that the power density spectrum of Rxx(t) according to equation (3) exhibits the first zero crossing at $f_0=1/\Delta t$, and thus, for the accurate tuning for example of a low-pass filter with a cut-off frequency $f_c$, $f_0$ should be chosen greater than $f_c$. A good choice here is $f_c \sim f_0/5$, so that the width of each pulse of the pseudo-random sequence or input signal x(t) should be $\Delta t \leq \frac{1}{5} f_c$.

Figure 1:
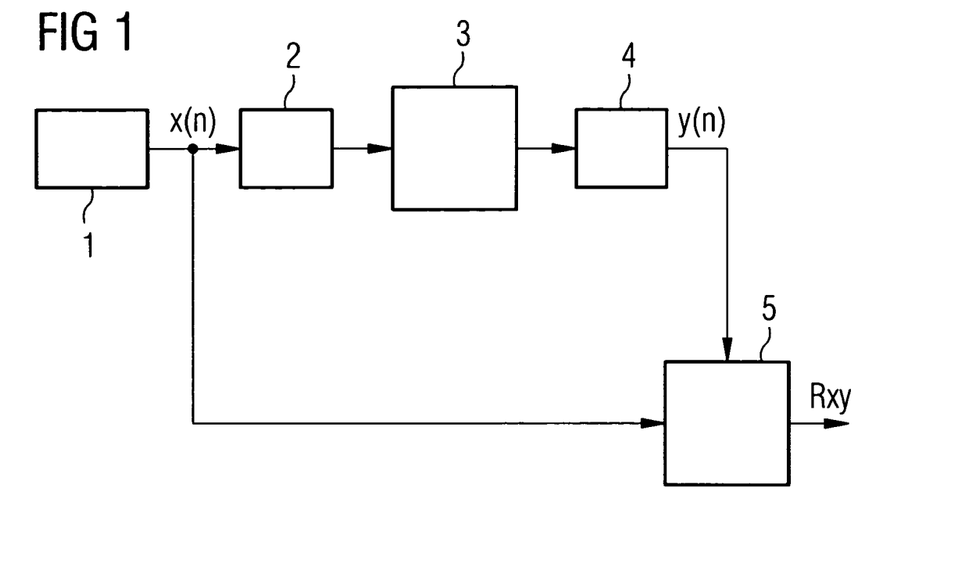
FIG. 1 is a block diagram of an apparatus for determining a cross-correlation function according to the present invention.

A block diagram of an apparatus for determining the cross-correlation function of a filter to be tuned according to the present invention is shown in FIG. 1. The apparatus shown in FIG. 1 comprises means 1 for generating the pseudo-random input sequence. This sequence has the properties as described above, i.e. Δt is a sequence of rectangular pulses with constant width Δt wherein each pulse assumes one of two given values with the same probability. This sequence x(t) is in the following also denoted with x(n), wherein n represents a sampling index of x(t). As means 1 for generating the pseudo-random sequence a Linear Feedback Shift Register (LFSR) with a suitable number of stages may be used. Such a LFSR comprises a linear chain consisting of a simple shift register in which either a binary weighted modulo of some of the taps of the shift register is fed back to the input (so-called Fibonacci implementation) or the contents of which are modified at every stage by a binary weighted value of the output stage. These LFSRs are well-known in the art for producing pseudo-random sequences and shall not be further described here.

The advantage of using such an LFSR is that if the initial state of the shift register is set to a fixed value, that is, initial states of flip-flops used in the LFSR have been set, the generated pseudo-random sequence is univocally determined. Consequently, the tail of its auto-correlation function is always the same and the input-output cross-correlation Rxy depends only on the configuration of the filter. In other words, the tails of the auto-correlation function of the input sequence x(t) do not depend on the particular realization of a stationary and ergodic process x(t).

The digital output of the means 1 are then fed to a Digital-to-Analog-Converter (DAC) 2. Since the pseudo-random sequence x(n) only assumes two values, the DAC can be realized in a very simple manner with two switches which connect the output of the DAC 2 with one of two given reference voltages depending on the current value of x(n). The output signal of DAC 2 is then fed to a filter 3 which is the filter to be tuned with the method and apparatus of the present invention. The response or output of the filter is then in turn fed to an Anolog-to-Digital-Converter (ADC) 4 which generates, with its sampling frequency $f_{out}$, the output sequence y(n); n again denoting the number of the respective sample.

Both the input sequence x(n) and the output sequence y(n) are fed to a calculating unit 5 which calculates the cross-correlation function Rxy(m). m again denotes the number of the sample since, as the input and output sequences are both sampled signals, also the cross-correlation function Rxy is such a sequence of samples. m directly corresponds to the time t via the sampling rate.

For this case of sampled sequences, equation (1) transforms to $$Rxy(m) = \lim_{L \to \infty} \frac{1}{L} \sum_{n=0}^{L-1} x(n)y(n+m) \quad (5)$$

wherein L is the number of the samples used which is obviously directly related to the sampling frequency $f_{out}$ of the ADC 4. $f_{out}$ should be greater than $1/\Delta t$ in order to generate a suitable number of significant samples of Rxy and to get at least one output sample for each period of the pseudo-random input sequence x(n).

Another issue which may affect the quality of the cross-correlation function Rxy is the quantization error of the ADC 4. However, a very low resolution ADC 4 may be employed as quantization errors are averaged by the cross-correlation operation of equation (5). If L is sufficiently high, even a one-bit ADC, i.e. a simple comparator, can be employed for tuning purposes. This greatly simplifies the implementation of the system and also is of particular relevance when a high sampling rate $f_{out}$ is needed since in general low resolution ADCs are faster than high resolution ADCs. The implementation of the calculation unit 5 is also quite simple since it only has to effect the calculation of equation (5) (without the limits).

Figure 2:
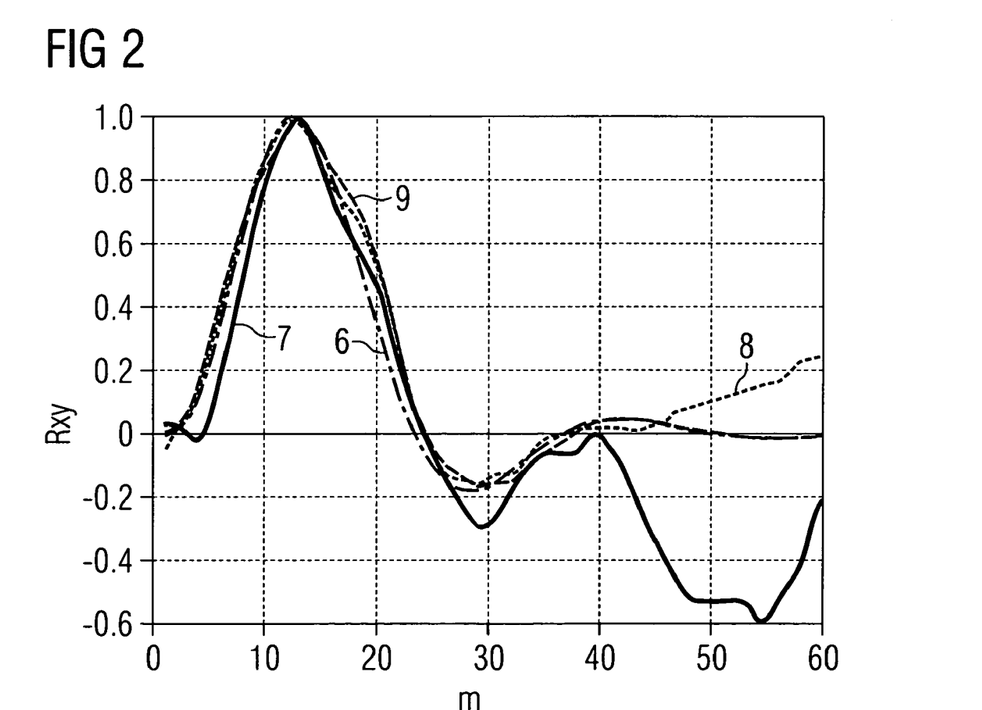
FIG. 2 shows cross-correlation functions obtained with the apparatus of FIG. 1 with different parameters.

FIG. 2 shows different estimations of the cross-correlation function of a Butterworth low-pass filter used as an example for a continuous time filter 3. To obtain these cross-correlation functions, the apparatus described above with reference to FIG. 1 with a one-bit ADC 4 was used. In FIG. 2, the value of the cross-correlation function Rxy depending on the number of the sample m is shown. Curve 6 shows the ideal or theoretical curve which should be obtained. Curve 7 shows a calculated cross-correlation function for a length of the input sequence x(n) of N=31. Curve 8 shows the cross-correlation function for N=63, and curve 9 shows the cross-correlation function for N=511. It should be noted that N is not equal to L of equation (5) since L also depends on the output sampling frequency $f_{out}$. Basically, L corresponds to $N \cdot \Delta t \cdot f_{out}$.

As can be seen in FIG. 2 for low values of m(m<40) all the calculated curves correspond rather well to the ideal curve. For greater values of m, curves 7 and 8 deviate significantly from the ideal curve, while curve 9 still corresponds well to the ideal curve.

If for tuning purposes as described later samples with low index m are used, even rather short input sequences may be sufficient to obtain good tuning.

As a conclusion, up to now it has been shown that an apparatus for calculation the cross-correlation function of a filter to be tuned as shown in FIG. 1 can be implemented in a simple manner with a single bit DAC and a single bit ADC while still yielding good results for the cross-correlation function.

Next, it will be shown how the cross-correlation function Rxy obtained in this way can be used for tuning the filter.

Figure 3:
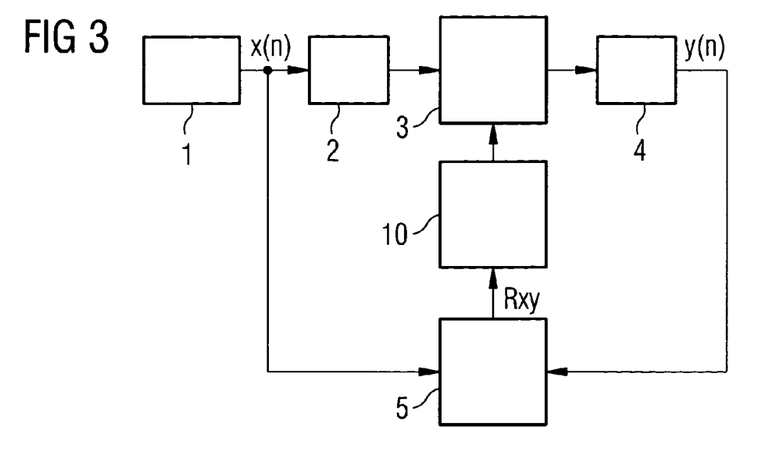
FIG. 3 shows a block diagram of an apparatus for tuning a filter according to an embodiment of the present invention.

FIG. 3 shows an embodiment of the present invention wherein the blocks which are equal to the blocks of FIG. 1 are designated with the same reference numeral. In contrast to FIG. 1, the embodiment of the invention shown in FIG. 3 additionally as a tuning control logic 10 which evaluates the cross-correlation function Rxy calculated by calculation unit 5. As already has been explained, the cross-correlation Rxy is a good approximation of the impulse response h(t) of the filter. By comparing this calculated cross-correlation function Rxy with an ideal or desired cross-correlation function corresponding to the desired impulse response of the filter, deviations of the filter from the desired behavior can be detected and the filter can be tuned correspondingly. In particular, one or more performance parameters of the filter, like a cut-off frequency $f_c$, a gain or a quality factor can be tuned. For this purpose, it would be preferable if only a limited number or even only one of the sampling points m of the cross-correlation function Rxy had to be evaluated. Therefore, it is necessary to have a criterion for sampling points m suitable for this task.

Assuming that l performance parameters or specifications $s_j$, j=1, 2, . . . , l have to be tuned, the most advantageous situation would occur if a tolerance interval $[s_{jmin}, S_{jmax}]$ defined for each $s_j$ would map monotonically in a corresponding interval of at least one of the samples of the cross-correlation function Rxy. In this case, the procedure would consist in tuning only one performance parameter or specification at a time, on the basis of the comparison between the calculated value of a suitable sample of Rxy and the corresponding desired value.

If this situation does not occur, a study of the sensitivity of a given sample Rxy(m) of Rxy with respect to the performance parameter $s_j$ is required. These sensitivities may be expressed in terms of the partial derivatives $$\partial ij = \partial Rxy(m_i)/\partial s_j$$

A high absolute value of a $\partial_{ij}$ means that the specific sample $m_i$ is particularly sensitive to variation of the performance parameter $s_j$. With these values, it is possible to identify suitable choices for sampling points of Rxy to be evaluated for tuning in order to approximate the ideal above-described mapping.

A filter is characterized by all its performance parameters, which may be written in the form of a performance parameter $\overline{S}=(s_1, S_2, \ldots, s_l)$. $\overline{S}$ is the vector of the nominal or desired performance parameters. If a sample of the cross-correlation function Rxy($m_i$) exists in which the following condition is met:

$$|\partial 11(\overline{S})| >> |\partial 12(\overline{S})|, \ldots, |\partial il(\overline{S})| \quad (6)$$

it has been shown in F. Corsi, C. Marzocca, G. Matarrese, "Defining a bist-oriented signature for mixed-signal devices", Proceedings of the IEEE Southwest Symposium on Mixed-Signal Design, pp. 202–207, 2003 that $$Rxy(S, m1) > Rxy(\overline{S}, m1) \Rightarrow s_1 > \bar{s}_1 \quad \text{if } \partial_{il}(\overline{S}) > 0 \quad (7)$$
$$Rxy(S, m1) < Rxy(\overline{S}, m1) \Rightarrow s_1 < \bar{s}_1$$

If $\partial 11(\overline{s})<0$ the reverse relationships between $s_1$ and $\bar{s}_1$ are valid. Consequently, it is possible to tune the performance parameter $s_1$ to its nominal value by means of comparing the value of the sample $m_1$ of the calculated cross-correlation function with the corresponding value of the desired cross-correlation function.

Once the performance parameter $s_1$ has been tuned, the next sample $m_2$ of the cross-correlation function to be used for tuning the next performance parameter $S_2$ can be chosen as a one which satisfies the less restrictive condition:

$$|\partial_{22}(\overline{S})| >> |\partial_{23}(\overline{S})|, \ldots, |\partial_2(\overline{S})| \quad (8)$$

In other words, after the first performance parameter $s_1$ has been tuned, the sample Rxy($m_2$) for tuning the second specification $S_2$ can be chosen regardless of the value of $\partial_{21}$.

By iterating this procedure, a set of l sampling points $m_1$, $m_2$, . . . , $m_l$ can be chosen as the minimum set of samples needed to tune all the performance parameters of the filter to the nominal values within given tolerances.

Figure 4:
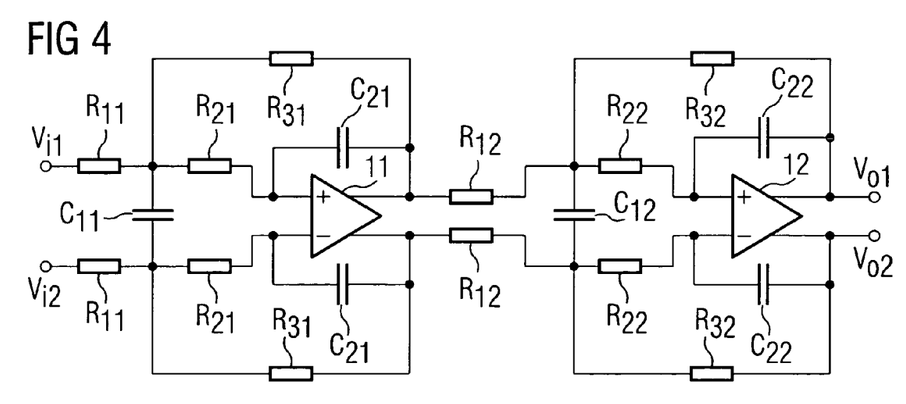
FIG. 4 shows a filter which may be tuned with the embodiment of FIG. 3.

This tuning of a filter will be now described for a specific examples of a filter which is shown in FIG. 4. This filter may be used as an anti-aliasing filter for the base band of UMTS receivers like the ones described in D. Manstretta, R. Castello, F. Gatta, P. Rossi, F. Svelto, "A 0.18 μm CMOS Direct-conversion receiver front-end for UMTS", IEEE International Solid-State Circuits Conference, vol. XLV, pp. 240–241, February 2002. Such a filter serves for anti-aliasing the ADC sampling frequency, for filtering of inter-modulation interference which is necessary to reduce the dynamic range of a following ADC, and for partial attenuation of adjacent channels. For these reasons, a very accurate filter transfer function is required.

The filter shown has a forth order low-pass Butterworth transfer function with a pole frequency of approximately 2 MHz and a DC (Direct Current)-gain of unity. Other filter requirements like linearity or noise do not concern the present invention and will not be discussed here.

The filter shown in FIG. 4 is built as a cascade of two multi-path biquadratic cells, the first of which is built around an operational amplifier 11 and the second of which is built around an operational amplifier 12. Each of the operational amplifiers 11, 12 is connected with capacitors $C_{ij}$ and resistors $R_{ij}$ in a similar manner. Here, the first index i represents the number of the respective resistor or capacitor, and the second index j refers to the biquadratic cell in which it is built. So, $R_{i1}$ is a resistor attributed to operational amplifier 11, while $R_{i2}$ is the corresponding resistor attributed to operational amplifier 12. The filter is adapted to process differential signals. The input pins or voltages are denoted with $V_{i1}$ and $V_{i2}$, the output pins or voltages with $V_{o1}$ and $V_{o2}$.

In the following, the abbreviation $R_i$ or $C_i$ will be used if a property of a resistor or capacitor applies to both the first biquadratic cell and the second biquadratic cell, that is both for j=1 and j=2.

Each cell has a capacitor $C_1$ between its input pins, and two feedback paths, one with a resistor $R_3$ and one with a capacitor $C_2$ for each of the inputs/outputs of the respective operational amplifier 11, 12. Furthermore, input resistors $R_1$, $R_2$ are provided.

Figure 5:
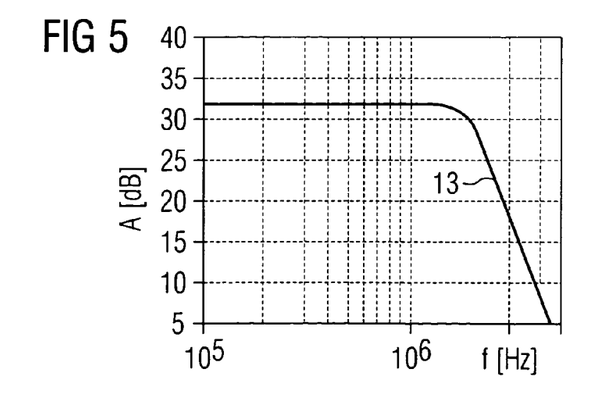
FIG. 5 shows the frequency characteristic of the filter of FIG. 5.

The frequency response of such a filter is shown in FIG. 5, wherein curve 13 shows the amplitude of the filtered signal in decibel depending on the frequency of the applied signal. It can be seen that the filter exhibits a low-pass filter behavior with a cut-off frequency or pole frequency of roughly 2 MHz.

The use of multipath biquadratic cells allows to use only one operational amplifier for each couple of poles desired with a consequent power saving. The transfer function of one multipath biquadratic cell is given by:

$$T(s) = \frac{-G_1 G_2}{C_1 C_2 s^2 + C_2(G_1 + G_2 + G_3) + G_2 G_3} \quad (9)$$

wherein $G_{1=1}/R_1$, $G_{2=1}/R_2$ and $G_{3=1}/R_3$. The characteristic performance parameters of each cell are the static gain Av, the quality factor Q and the pole frequency $\omega_c$, which are given by:

$$A_v = \frac{-G_1 G_2}{G_2 G_3}; \quad Q = \sqrt{\frac{C_1}{C_2}} \cdot \frac{1}{\frac{G_1}{\sqrt{G_2 G_3}} + \sqrt{\frac{G_2}{G_3}} + \sqrt{\frac{G_3}{G_2}}}; \quad (10)$$

$$\omega_c = \sqrt{\frac{G_2 G_3}{C_1 C_2}}$$

The following tables give the nominal values for both the first and the second biquadratic cell:

|  | 1st Cell | 2nd Cell |
|---|---|---|
| $R_1$ | 10 kΩ | 10 kΩ |
| $R_2$ | 10 kΩ | 10 kΩ |
| $R_3$ | 10 kΩ | 10 kΩ |
| $C_1/2$ | 4.08 pF | 9.86 pF |
| $C_2$ | 13.94 pF | 5.77 pF |
| $\omega_c$ | 2.11 MHz | 2.11 MHz |
| Q | 0.54 | 1.3 |

It should be noted that the static gain Av and the quality factor Q depend only on the ratio of homogeneous components, i.e. on ratios between either capacitances or conductances. In contrast, the pole frequency $\omega_c$ depends on ratios of nonhomogeneous components, namely of ratios of conductances with capacitances.

The value of $\omega_c$ can be tuned by changing values of one or both of the resistors $R_2$, $R_3$ and/or values of one or more of the capacitors $C_1$, $C_2$. This can be done for example by realizing at least one of these components as an array of unit elements which may be turned on and off by switches controllable by for example a digital control word. The number of unit elements corresponds to the number of control bits and gives the accuracy of control of the respective component and therefore of the parameter $\omega_c$ to be tuned.

Figure 6:
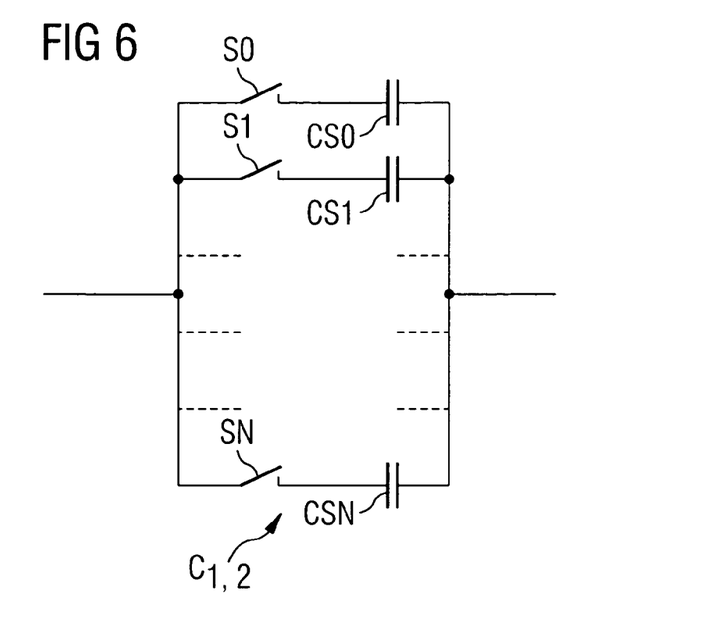
FIG. 6 shows a capacitor array usable for tuning the filter of FIG. 4.

In FIG. 6, a possible realization of such an array which may be used as capacitor $C_1$ or capacitor $C_2$ is shown. The array comprises N capacitors CS0, CS1, . . . CSN connected in parallel. A switch S0, S1, . . . , SN is attributed to each of the capacitors CS0, CS1, . . . , CSN. Each bit of a digital control word with N bits controls one of the switches S0, S1, . . . SN. Preferably, all the capacitors CS0, CS1, . . . , CSN have the same value 5C. The minimum capacitance of the array is given when only one of the switches S0, S1, . . . , SN is closed. Closing more of these switches then increases the overall capacitance. A corresponding array with resistors may be used to realize a tuneable resistor.

For typical receiver channels, it is required to tune the pole frequency $\omega_c$ to within a relative error of lower than 5% with respect to its nominal value. Consequently, the array shown in FIG. 6 has to enable a control of $\omega_c$ fine enough to achieve this end.

Since both the static gain Av and the quality factor Q depend on the ratio of homogeneous elements, these performance parameters are less critical. Consequently, for most applications it will be sufficient only to tune the pole frequency $f_c = \omega_c/2\pi$.

It should be noted that for these kinds of filter the quality factor is rather low, therefore the performance of the operational amplifiers 11, 12 is not critical in terms of unity gain frequency and dc gain. This also avoids a large passive component spread.

As has been explained before (see equations (6) to (8)) one sample m of the cross-correlation function Rxy can be used for tuning the filter in case only the performance parameter $f_c$ has to be tuned, i.e. this sample m may be used as a signature of the circuit. Corresponding to equation (6), this sample should satisfy the condition:

$$\left| \frac{\partial Rxy(m)}{\partial f_c} \right| \gg \left| \frac{\partial Rxy(m)}{\partial A_v} \right|, \left| \frac{\partial Rxy(m)}{\partial Q} \right| \quad (11)$$

for the nominal cross-correlation function Rxy.

Figure 7:
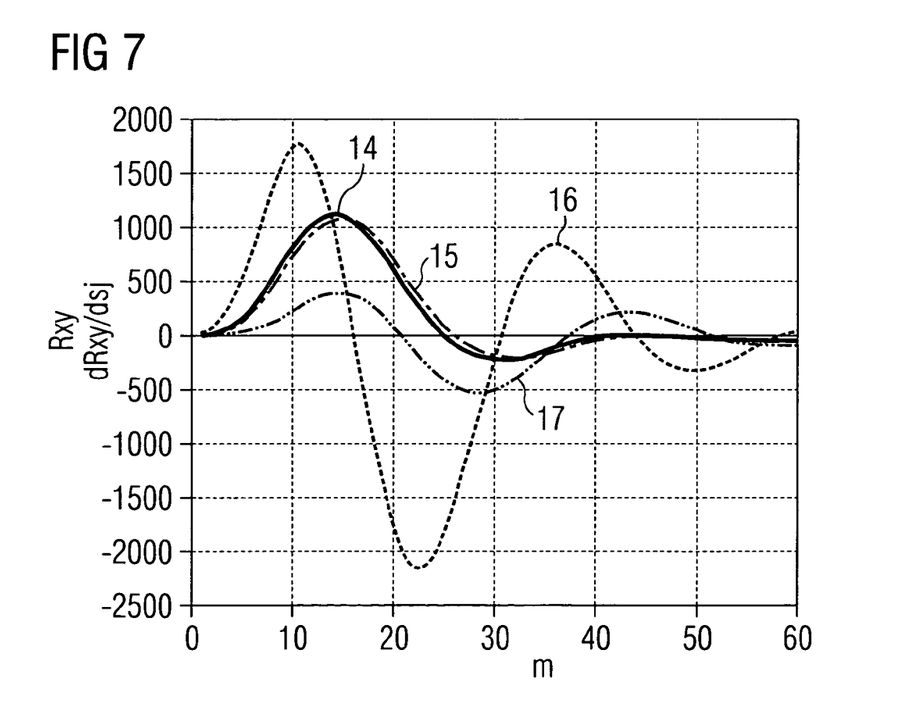
FIG. 7 shows the cross-correlation function and derivates thereof of the filter of FIG. 4.
Figure 8:
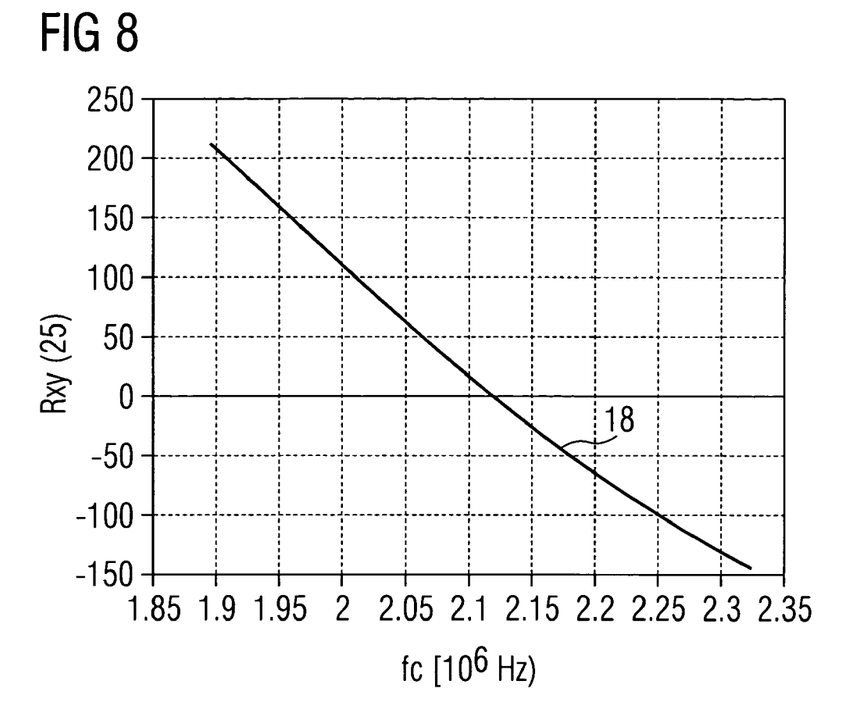
FIG. 8 shows a tuning curve for a cut-off frequency of the filter of FIG. 4.

FIG. 7 shows, for a fourth order Butterworth filter like the one shown in FIG. 4, the desired or nominal cross-correlation function Rxy and its partial derivatives of equation 11. In particular, curve 14 shows the nominal cross-correlation function Rxy, curve 15 shows $$\frac{\partial Rxy(m)}{\partial A_v},$$

curve 16 shows $$\frac{\partial Rxy(m)}{\partial f_c},$$

and curve 17 shows $$\frac{\partial Rxy(m)}{\partial Q}.$$

Applying equation (11) to the graphs of FIG. 7, it follows that the signature sample m for tuning the pole frequency $f_c$ should possibly be in the range from m=20 to m=23, as in this range the partial derivative Rxy taken with respect to $f_c$ assumes a much greater absolute value than the other partial derivatives. However, in this case an even better choice would be the first zero-crossing sample of the nominal cross-correlation function Rxy, i.e. m=25. At this sample, $$\frac{\partial Rxy(m)}{\partial f_c}$$

is still significantly greater than the other partial derivatives, and this choice would greatly simplify the hardware implementation of the tuning algorithm which is implemented in block 10 of FIG. 3. In this case, for tuning it would be only necessary to consider the sign of the sample m=25 of the calculated cross-correlation function Rxy since $\bar{s}_1$ in equation (7) would be zero.

Figure 11:
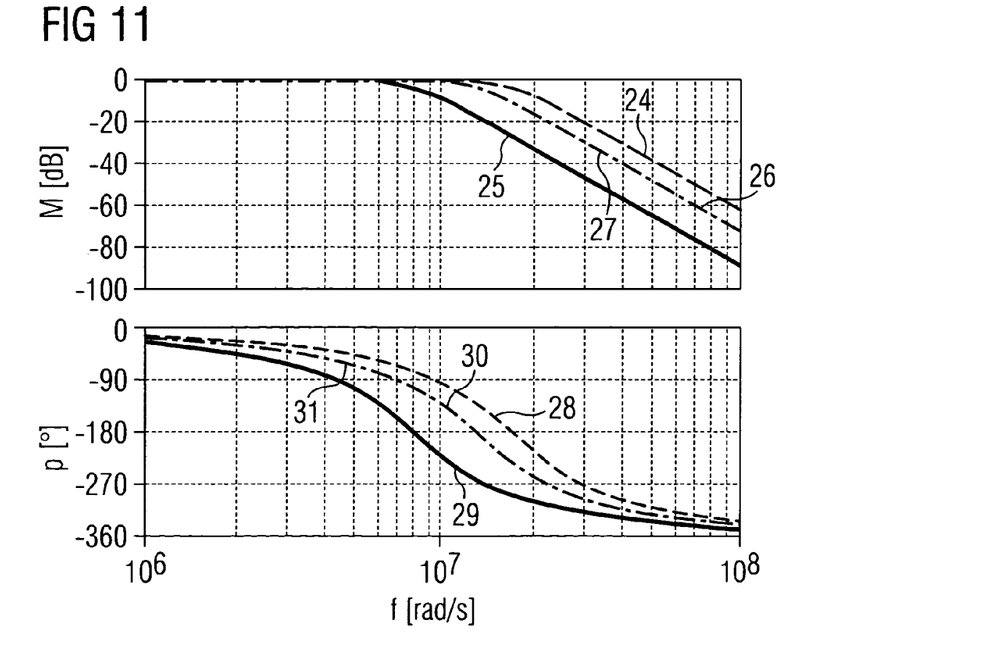
FIG. 11 shows Bode diagrams corresponding to the scenario of FIG. 10.

To clarify this, FIG. 11 shows the value of the sample m=25 of the cross-correlation function versus the pole frequency $f_c$. It can be seen that for values of $f_c$ smaller than the nominal value of 2.11 MHz Rxy(25) is positive, while for values $f_c$ exceeding 2.11 MHz it is negative. Thus, a simple tuning algorithm could be implemented:

If, for instance, Rxy(25) assumes a negative value for a given configuration of the tuning capacitor array shown in FIG. 6, this also implies that $f_c$>2.11 MHz, thus the total capacity of the array $C_{array}$ according to equation (10) must be increased to approach the nominal pole frequency. A possible simple procedure consists in closing one of the switches S0, S1, . . . , SN of FIG. 6 at a time, i.e. adding one δC at a time, until the sample Rxy(25) becomes positive. The best tuning configuration would then be the one of the last negative sample and this first positive sample which has the smaller absolute value of Rxy(25). In the worst case, with this simple approach, the cross-correlation operation must be performed at most $2^{N-1}$ times if the tuning operation starts from an initial configuration $C_{array}=C_{off}+(2^{N-1})\delta C$, $C_{off}$ being the offset capacitance of the array.

In case a more sophistic algorithm like a binary search algorithm is implemented to find the best tuning configuration, the cross-correlation operation should be performed at most N times, therefore the tuning operation could be made even faster with a more sophisticated algorithm. In this case, for example a digital finite state machine would have to be added to implement the binary search algorithm. Therefore, the gain in tuning speed of such a solution must be assessed against this extra hardware needed.

In order to evaluate the efficiency of this tuning procedure, a set of worst-case simulation has been carried out on a high-level description of the filter used. A technological spread of ±20% has been assumed both for the resistors and for the capacitors of the filter. The capacitor arrays have been sized considering a global technological spread of 40%. The cross-correlation function has been calculated according to the apparatus shown in FIG. 1, using a one-bit ADC with $f_{out}=5f_0$. The length N of the input sequence in this case is not critical for the tuning operation since, as has been explained with reference to FIG. 2, as significant deviations for short input sequences only leads to significant deviations for m>40, while in the present case m=25 is evaluated. Furthermore, estimations with LFSRs of different numbers of stages differ only in the tails, so the exact number of stages is not a very critical parameter. For the simulations, a LFSR of six stages with L=63 and $f_0=5f_c$ has been used.

In the simulations, the filter has been tuned by the first simple scheme proposed, that is by closing or opening one switch in the capacitor array at a time.

Figure 9:
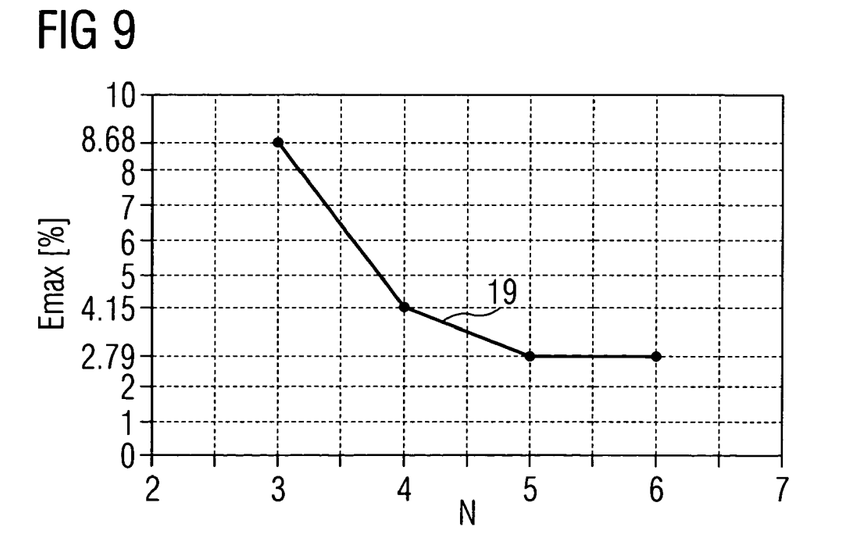
FIG. 9 shows tuning errors for different numbers of control bits.

Curve 19 of FIG. 9 shows the maximum relative error Emax in percent versus the number of bits of the control word for the capacitor array used, i.e. the number of capacitors and switches in the array. From FIG. 9, it appears that increasing N to values greater than 5 does not cause a further decrease of Emax since in this case the accuracy is limited by the accuracy of the calculation of the cross-correlation function. Consequently, for practical applications, an array with five capacitors with appropriate values should be enough.

Figure 10:
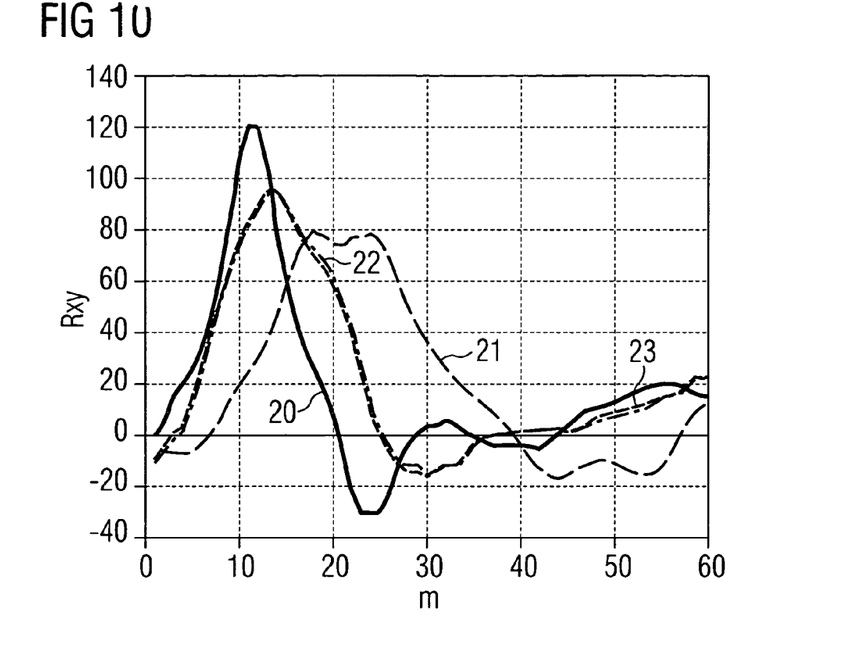
FIG. 10 shows cross-correlation functions before and after tuning the filter of FIG. 4 for worst-case scenarios.

In FIG. 10, the cross-correlation functions obtained for two worst-case values of $f_c$ as well as the nominal and the tuned curves of the cross-correlation function Rxy are shown. Curve 20 shows the calculated cross-correlation function when the pole frequency $f_c$ of the filter assumes the maximum possible value which is 2.8 MHz for the assumed tolerances of the resistors and the capacitors. Curve 21 shows the corresponding cross-correlation function Rxy for the minimum pole frequency which is 1.3 MHz. Curve 22 shows the nominal or desired cross-correlation function, and curve 23 shows the cross-correlation function after tuning. As can be seen, after tuning the calculated cross-correlation function corresponds very well with the desired cross-correlation function even if the extreme curves 20 or 21 are used as a starting point. FIG. 11 shows the corresponding Bode diagrams, wherein the upper graph shows the amplitude behavior M and the lower curve shows the phase behavior P of the filter in various states over the frequency of the signal applied to the filter. In the upper graph, curve 24 corresponds to the case of the maximum pole frequency, curve 25 corresponds to the case of the minimum frequency, curve 26 corresponds to the tuned case and curve 27 to the nominal or desired behavior. Accordingly, in the lower graph, curve 28 corresponds to the maximum pole frequency, curve 29 to the minimum pole frequency, curve 30 to the tuned case and curve 31 to the desired case. As can be taken from these diagrams, not only the cross-correlation functions can be adjusted very well with the proposed tuning method or apparatus, but also the actual behavior of the filter can be tuned very well.

In the following table a summary of the tuning results for different bits of tuning is listed:

| Bit of tuning N | Resistor Variation [%] | Capacitor Variation [%] | Minimum tuning capacitor δC | Maximum relative error on fc [%] |
|---|---|---|---|---|
| 3 | 15 | 12 | 555 fF | 8.68 |
| 4 | 12 | 20 | 259 fF | 4.15 |
| 5 | 20 | 20 | 125 fF | 2.79 |
| 6 | 20 | 20 | 62 fF | 2.79 |

In particular, it can be seen that the value of each capacitor in the capacitor array δC has been varied according to the number of bits of tuning so that in each case a sufficiently large tuning range can be covered. The assumed resistor and capacitor variations and the maximum relative error already shown in FIG. 9 is also given.

In summary, the present invention provides the following advantages:
- the use of a pseudo-random test signal which can be generated with a very simple circuit in a small chip area
- the tuning of the overall frequency response and not only a part matched with it
- the use of a very simple tuning circuitry embedding the evaluation of the cross-correlation.

Consequently, the present invention is very well suited for on-chip implementation with the filter.

The foregoing description should be seen as illustrative only and not in a limitative sense. Many variations and deviations from the described embodiment are possible without departing from the scope of the present invention. In particular, the present invention may be applied to other filters than the described Butterworth filters.

We claim:

1. A method for tuning a filter, the filter including at least one adjustable element for adjusting at least one performance parameter, the method comprising:

a) applying a pseudo-random test sequence to the filter,
b) determining at least one sample value of a calculated cross-correlation function of the test sequence and the filtered test sequence, and
c) adjusting the at least one adjustable element of the filter until the at least one sample value of the calculated cross-correlation function has predefined relationship with a corresponding sample value of a nominal cross-correlation function for the filter.

2. The method according to claim 1, wherein the filter is a time-continuous filter.

3. The method according to claim 1, wherein the nominal cross-correlation function is an estimate of a desired impulse response function of the filter.

4. The method according to claim 1, wherein step b) further comprises:
selecting the at least one sample value to be determined such that a partial derivative of the nominal cross-correlation function with respect to a first performance parameter at the at least one sample value is greater than partial derivatives of the nominal cross-correlation function with respect to other ones of the at least one performance parameters at the at least one sample value.

5. The method according to claim 1, wherein step b) further comprises selecting the at least one sample value to be determined such that the at least one sample value corresponds to a predetermined threshold value of the nominal cross-correlation function.

6. The method according to claim 5, wherein step c) further comprises adjusting the at least one adjustable element based on a comparison of the at least one sample value of the calculated cross-correlation function with the predetermined threshold value.

7. The method according to claim 5, wherein the predetermined threshold value is zero.

8. The method according to claim 7, wherein step c) further comprises adjusting the at least one adjustable element based on the sign of the at least one sample value of the calculated cross-correlation function.

9. The method according to claim 1, wherein step a) further comprises generating the pseudo-random test sequence using a linear feedback shift register.

10. The method according to claim 1, wherein step a) further comprises generating the pseudo-random test sequence digitally and providing the pseudo-random test sequence to the filter through a digital-to-analog converter.

11. The method according to claim 10, wherein the digital-to-analog-converter comprises a one-bit digital-to-analog converter.

12. The method according to claim 1, further comprising, after step a) sampling the filtered test sequence using an analog-to-digital converter.

13. The method according to claim 12, wherein a sampling frequency of the analog-to-digital converter is greater than the inverse of a pulse length of the pseudo-random test sequence.

14. The method according to claim 1, wherein the at least one performance parameter includes at least one of the group consisting of a cut-off frequency of the filter, a quality factor of the filter and a static gain of the filter.

15. The method according to claim 1, wherein the at least one adjustable element comprises a controllable plurality of capacitors.

16. The method according to claim 1, wherein the at least one adjustable element comprises a controllable plurality of resistors.

17. An apparatus for tuning a filter, the filter having at least one adjustable element for adjusting at least one performance parameter of the filter, the apparatus comprising:
a pseudo-random test sequence generator operably connected to provide a pseudo-random test sequence to the filter, the filter configured to generate a filtered test sequence based on the pseudo-random test sequence,
a calculation circuit connected to the pseudo-random test sequence generator and to an output of the filter, the calculation circuit configured to determine at least one sample value of a cross-correlation function of the test sequence and the filtered test sequence,
an adjustment circuit operably coupled to adjust the at least one adjustable element as a function of the determined at least one sample value of the cross-correlation function, said adjustment circuit configured to adjust the at least one adjustable element until the at least one sample value of the cross-correlation function has a predetermined relationship with a corresponding sample of a nominal cross-correlation function for the filter.

18. The apparatus according to claim 17, wherein the filter is a time-continuous filter.

19. The apparatus according to claim 17, wherein the nominal cross-correlation function corresponds to a desired impulse response function of the filter.

20. The apparatus according to claim 17, wherein the calculation circuit is further configured to select the at least one sample value to be determined such that a partial derivative of the nominal cross-correlation function with respect to a first performance parameter at the at least one sample value is greater than partial derivatives of the nominal cross-correlation function with respect to other ones of the at least one performance parameters at the at least one sample value.

21. The apparatus according to claim 17, wherein the calculation circuit is configured to select the at least one sample value to be determined such that the at least one sample value corresponds to a predetermined threshold value of the nominal cross-correlation function.

22. The apparatus according to claim 21, wherein the adjustment circuit is configured to adjust the at least one adjustable element based on a comparison of the at least one sample value of the cross-correlation function with the predetermined threshold value.

23. The apparatus according to claim 21, wherein the predetermined threshold value is zero.

24. The apparatus according to claim 23, wherein the adjustment circuit is configured to adjust the at least one adjustable element depending on a sign of the at least one sample value of the cross-correlation function.

25. The apparatus according to claim 17, wherein the means for generating the pseudo-random test sequence comprise a linear feedback shift register for generating the pseudo-random test sequence.

26. The apparatus according to claim 17, wherein the pseudorandom test sequence generator is configured to generate a digital pseudo-random test sequence, and wherein the apparatus further comprises a digital-to-analog converter operably connected to convert the digital pseudo-random test sequence into an analog pseudo-random test sequence to be provided to the filter.

27. The apparatus according to claim 26, wherein the digital-to-analog converter further comprises a one-bit digital-to-analog converter.

28. The apparatus according to claim 17, wherein the apparatus further comprises an analog-to-digital converter having a converter input and a converter output, the converter input connected to an output of the filter and the converter output connected to the calculation circuit.

29. The apparatus according to claim 28, wherein the analog-to-digital converter comprises a one-bit analog-to-digital-converter.

30. The apparatus according to claim 28, wherein a sampling frequency of the analog-to-digital-converter is greater than an inverse pulse duration of the pseudo-random test sequence.

31. The apparatus according to claim 17, wherein the at least one performance parameter comprises at least one of the group consisting of a cut-off frequency of the filter, a quality factor of the filter and a static gain of the filter.

32. The apparatus according to claim 17, wherein the apparatus comprises the filter, the filter being integrated with the calculation circuit and the adjustment circuit.

33. The apparatus according to claim 32, wherein the filter comprises a Butterworth filter.

34. The apparatus according to claim 32, wherein the filter comprises at least one multi-pass biquadratic cell.

35. The apparatus according to claim 32, wherein the at least one adjustable element comprises a controllable plurality of capacitors.

36. The apparatus according to claim 32, wherein the at least one adjustable element of the filter comprises a controllable plurality of resistors.

* * * * *